US011665852B2

(12) United States Patent
He

(10) Patent No.: US 11,665,852 B2
(45) Date of Patent: May 30, 2023

(54) INFORMATION HANDLING SYSTEM FAN HAVING A CONCAVE HOUSING

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/447,376

(22) Filed: Sep. 10, 2021

(65) Prior Publication Data
US 2023/0081967 A1   Mar. 16, 2023

(51) Int. Cl.
H05K 7/20 (2006.01)
H05K 5/02 (2006.01)
G06F 1/20 (2006.01)

(52) U.S. Cl.
CPC ......... *H05K 7/20172* (2013.01); *G06F 1/203* (2013.01); *G06F 1/206* (2013.01); *H05K 5/0213* (2013.01); *H05K 7/20209* (2013.01)

(58) Field of Classification Search
CPC ............. H05K 7/20172; H05K 5/0213; H05K 7/20209; G06F 1/203; G06F 1/206
See application file for complete search history.

(56) References Cited

U.S. PATENT DOCUMENTS

| | | | | |
|---|---|---|---|---|
| 5,751,080 A * | 5/1998 | Hong | .................... | H02K 5/1675 310/67 R |
| 6,565,334 B1 * | 5/2003 | Bradbury | .............. | F04D 29/384 417/244 |
| 6,896,095 B2 * | 5/2005 | Shah | ......................... | F01P 5/06 181/198 |
| 7,348,753 B2 * | 3/2008 | Kasahara | .................. | H02P 8/10 318/696 |
| 7,360,992 B2 * | 4/2008 | Cho | ........................ | F04D 25/08 165/122 |

(Continued)

FOREIGN PATENT DOCUMENTS

| | | | | |
|---|---|---|---|---|
| EP | 2943847 B1 * | 9/2019 | ............. | G06F 1/203 |
| EP | 3919747 A1 * | 12/2021 | ............. | F04D 17/08 |

OTHER PUBLICATIONS

Jia Zizhou CN 106979173, Fan blade structure and device, Jul. 25, 2017, ESPACENET 17447376 translate (Year: 2017).*

*Primary Examiner* — Michael A Matey
(74) *Attorney, Agent, or Firm* — McDermott Will & Emery LLP

(57) ABSTRACT

In one or more embodiments, an information handling system fan may include: a hub; multiple fan blades radially attached to the hub and configured to rotate perpendicularly to a longitudinal axis of the information handling system fan; an electric motor; a drive shaft parallel to the longitudinal axis of the information handling system fan that attaches the electric motor to the hub; and a housing that houses the hub, the multiple fan blades, and the electric motor. In one or more embodiments, the housing may have a concave portion perpendicular to the longitudinal axis of the information handling system fan, in which the housing may include a first vent in the concave portion of the housing to intake air as the multiple fan blades rotate and in which the housing may include a second vent configured to exhaust the air as the multiple fan blades rotate.

18 Claims, 13 Drawing Sheets

(56) References Cited

U.S. PATENT DOCUMENTS

| | | | | |
|---|---|---|---|---|
| 8,014,149 B2* | 9/2011 | Hsu | ............ | H05K 7/20172 |
| | | | | 361/679.48 |
| 8,075,257 B2* | 12/2011 | Tien | ............ | G06F 1/20 |
| | | | | 415/203 |
| 2004/0197192 A1* | 10/2004 | Jarrah | ............ | F04D 29/281 |
| | | | | 416/206 |
| 2004/0228728 A1* | 11/2004 | Kuo | ............ | F04D 25/08 |
| | | | | 415/220 |
| 2006/0045774 A1* | 3/2006 | Lu | ............ | F04D 29/545 |
| | | | | 417/423.7 |
| 2009/0053053 A1* | 2/2009 | Lin | ............ | F04D 29/424 |
| | | | | 415/206 |
| 2009/0290307 A1* | 11/2009 | Hwang | ............ | F04D 17/16 |
| | | | | 417/423.1 |
| 2010/0316514 A1* | 12/2010 | Horng | ............ | H02K 3/47 |
| | | | | 417/422 |
| 2011/0267777 A1* | 11/2011 | Oike | ............ | H01L 23/467 |
| | | | | 361/697 |
| 2012/0247739 A1* | 10/2012 | Fujiwara | ............ | F04D 29/424 |
| | | | | 415/220 |
| 2013/0286297 A1* | 10/2013 | Fujiwara | ............ | H04N 5/64 |
| | | | | 348/836 |
| 2014/0118939 A1* | 5/2014 | Lin | ............ | F04D 29/4226 |
| | | | | 361/695 |
| 2015/0016061 A1* | 1/2015 | Wang | ............ | F04D 17/16 |
| | | | | 415/121.2 |
| 2016/0102672 A1* | 4/2016 | Liu | ............ | F16C 32/0427 |
| | | | | 417/423.12 |
| 2016/0369811 A1* | 12/2016 | Ling | ............ | F04D 29/663 |
| 2017/0199554 A1* | 7/2017 | Chen | ............ | H01L 23/38 |
| 2018/0051717 A1* | 2/2018 | Wang | ............ | F04D 29/281 |
| 2021/0378138 A1* | 12/2021 | Wang | ............ | G06F 1/203 |

\* cited by examiner

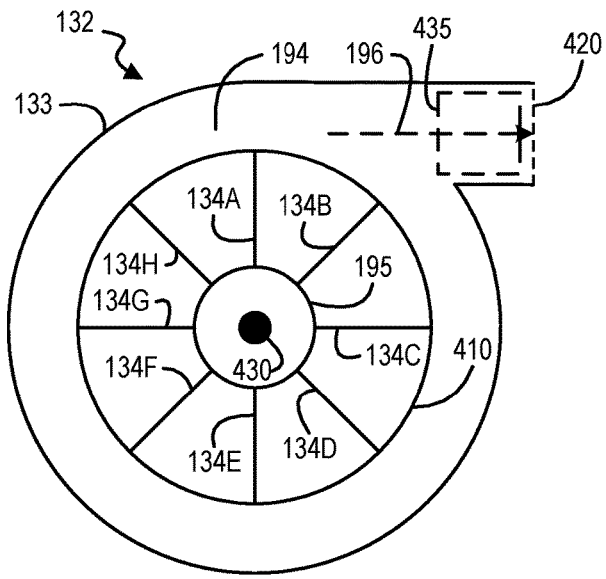
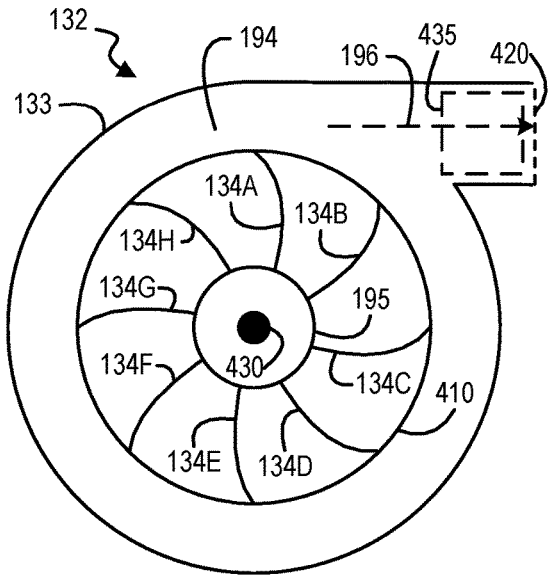
FIG. 4A  FIG. 4B
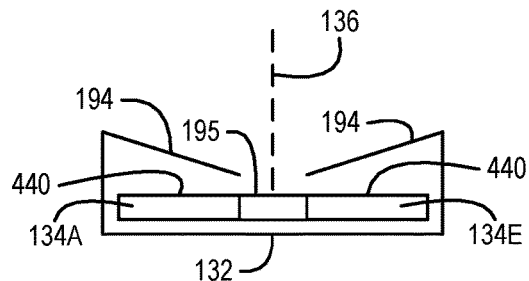
FIG. 4C
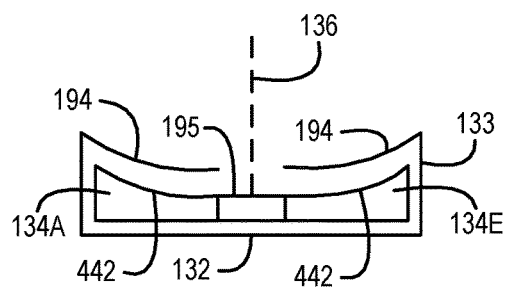
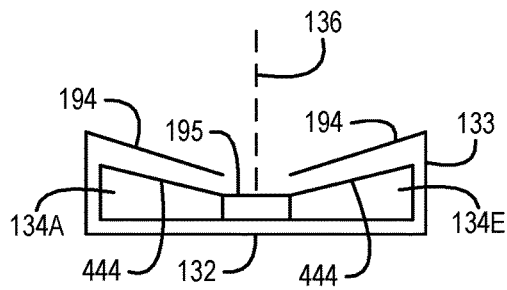
FIG. 4D  FIG. 4E

INFORMATION HANDLING SYSTEM FAN HAVING A CONCAVE HOUSING

BACKGROUND

Field of the Disclosure

This disclosure relates generally to information handling systems and more particularly to an information handling system fan having a concave housing.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, an information handling system may include: at least one processor; a memory medium, coupled to the at least one processor, that stores instructions executable by the at least one processor; and a fan. For example, the fan may include: a hub; multiple fan blades radially attached to the hub and configured to rotate perpendicularly to a longitudinal axis of the fan; an electric motor; a drive shaft parallel to the longitudinal axis of the fan that attaches the electric motor to the hub; and a housing that houses the hub, the multiple fan blades, and the electric motor. For instance, the housing may have a concave portion perpendicular to the longitudinal axis of the fan, in which the housing of the fan may include a first vent in the concave portion of the housing of the fan to intake air as the multiple fan blades rotate and in which the housing of the fan may include a second vent configured to exhaust the air as the multiple fan blades rotate. In one or more embodiments, the concave portion of the housing of the fan may be linear from an edge of the housing to the first vent. In one or more embodiments, the concave portion of the housing of the fan may be nonlinear from an edge of the housing of the fan to the first vent. In one or more embodiments, the fan may be configured to exhaust the air perpendicularly to the longitudinal axis of the fan. For example, the fan may be a centrifugal fan. In one or more embodiments, the concave portion of the housing may have multiple baffles.

In one or more embodiments, each fan blade of the multiple fan blades may have a top edge that corresponds to the concave portion of the housing of the fan. In one or more embodiments, each fan blade of the multiple fan blades may extend linearly from the hub within a plane perpendicular to the longitudinal axis of the fan. In one or more embodiments, each fan blade of the multiple fan blades may extend nonlinearly from the hub within a plane perpendicular to the longitudinal axis of the fan. In one or more embodiments, the instructions, which when executed by the at least one processor, may cause the information handling system to: receive temperature information that includes a temperature value; determine that the temperature value is at or above a threshold temperature value; and cause the fan to move air within the information handling system. For example, causing the fan to move air within the information handling system may be performed in response to determining that the temperature value is at or above the threshold temperature value, cause the fan to move air within the information handling system.

In one or more embodiments, an information handling system fan may include: a hub; multiple fan blades radially attached to the hub and configured to rotate perpendicularly to a longitudinal axis of the information handling system fan; an electric motor; a drive shaft parallel to the longitudinal axis of the information handling system fan that attaches the electric motor to the hub; and a housing that houses the hub, the multiple fan blades, and the electric motor. For example, the housing may have a concave portion perpendicular to the longitudinal axis of the information handling system fan, in which the housing includes a first vent in the concave portion of the housing to intake air as the multiple fan blades rotate and in which the housing includes a second vent configured to exhaust the air as the multiple fan blades rotate. In one or more embodiments, the concave portion of the housing may be linear from an edge of the housing to the first vent. In one or more embodiments, the concave portion of the housing may be nonlinear from an edge of the housing to the first vent. In one or more embodiments, the information handling system fan may be configured to exhaust the air perpendicularly to the longitudinal axis of the information handling system fan. For example, the information handling system fan may be a centrifugal fan. In one or more embodiments, the housing may include a duct between the multiple fan blades and the second vent.

In one or more embodiments, the concave portion of the housing may have multiple baffles. In one or more embodiments, each fan blade of the multiple fan blades may have a top edge that corresponds to the concave portion of the housing. In one or more embodiments, each fan blade of the multiple fan blades may extend linearly from the hub within a plane perpendicular to the longitudinal axis of the information handling system fan. In one or more embodiments, each fan blade of the multiple fan blades may extend nonlinearly from the hub within a plane perpendicular to the longitudinal axis of the information handling system fan.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which:

FIG. 4A illustrates an example of a fan with linearly radiating fan blades, according to one or more embodiments;

FIG. 4B illustrates an example of a fan with nonlinearly radiating fan blades, according to one or more embodiments;

FIG. 4C illustrates an example of a fan with linearly flat fan blades, according to one or more embodiments;

FIG. 4D illustrates an example of a fan with fan blades corresponding to a concave portion of a housing of the fan, according to one or more embodiments;

FIG. 4E illustrates another example of a fan with fan blades corresponding to a concave portion of a housing of the fan, according to one or more embodiments;

DETAILED DESCRIPTION

Figure 1A:
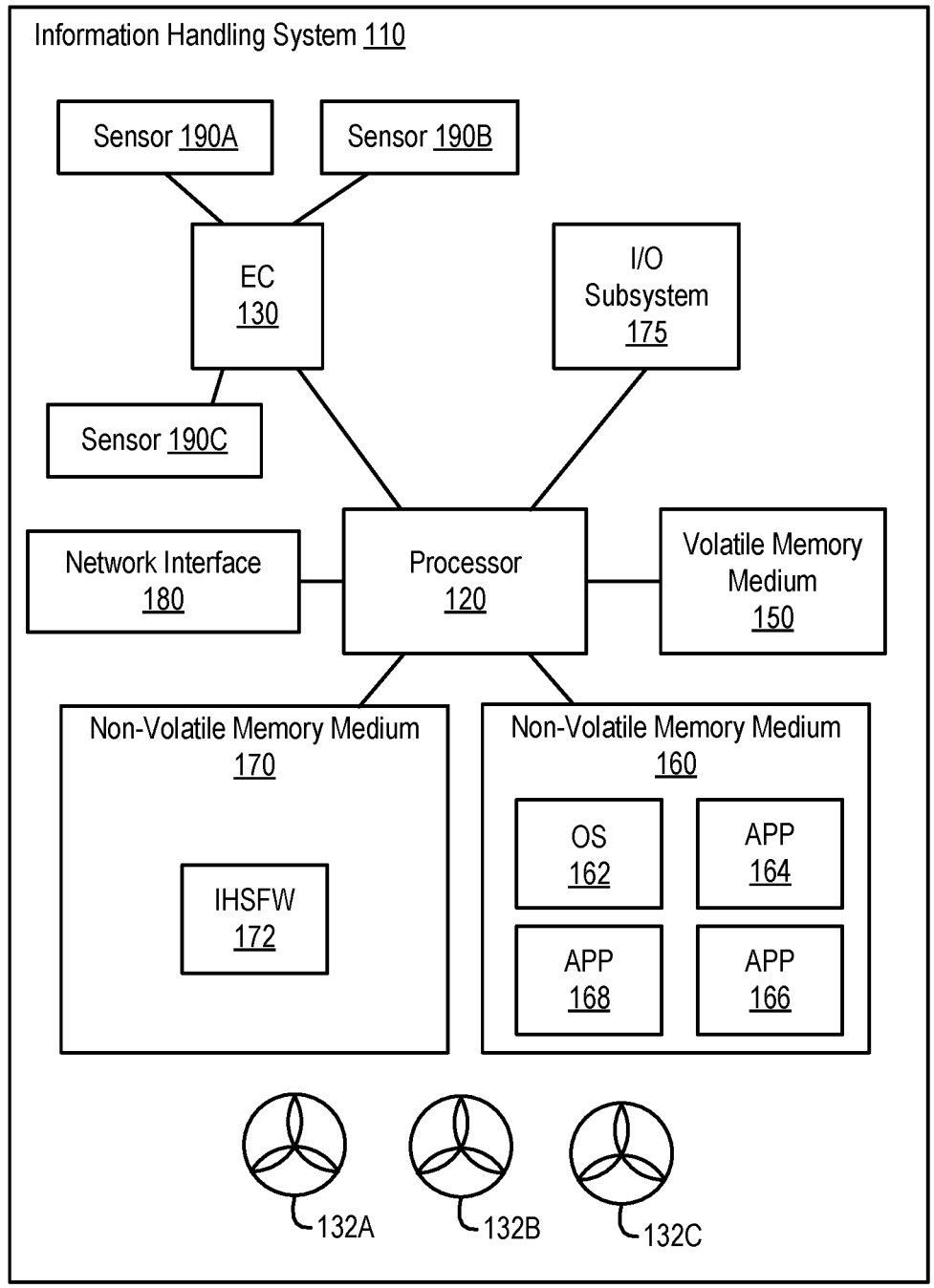
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, an information handling system fan of an information handling system may have a funnel shape (e.g., a concave shape) at an inlet side. For example, the information handling system may not have any air intake vents directly under the fan. In one or more embodiments, a flat, bottom portion of a chassis of the information handling system (e.g., a portable information handling system, such as a laptop) may not have a vent. For example, the flat, bottom portion of the chassis of the information handling system may be unvented or may be without any vent. For instance, a user may prefer the flat, bottom portion of the chassis of the information handling system to not have any vents. As an example, when the flat, bottom portion of the chassis of the information handling system is in contact with a lap of the user, a vent in flat, bottom portion of the chassis of the information handling system may be blocked or at least partially obstructed. In one or more embodiments, the fan may draw air in via a gap between the fan and the bottom cover (e.g., the flat, bottom portion of the chassis of the information handling system), which may reduce the airflow by more than half In one or more embodiments, the gap may be increased; however, that may reduce the fan height, which in turn reduces airflow.

In one or more embodiments, the funnel shape at the inlet side of the fan may slow down airflow near a center of the fan where the highest air speed and/or pressure drop occurs. For example, this may lower airflow impedance, which may be proportional to a square of air velocity (e.g., $P_{air} \sim V_{air}^2$). In one or more embodiments, a performance of the fan may be reduced slightly (e.g., about ten percent) compared with a flat top fan due to a reduction of some fan blade material, but a reduction of airflow impedance (about forty-five percent) of air squeezing and/or compressing into the fan may exceed a degradation of fan performance, which may result in a net gain about thirty-five percent more airflow into the fan.

In one or more embodiments, a flat top fan may have a highest airflow rate compared with a funnel top fan and a dome top fan, but the flat top fan may have a highest air impedance when a flat, bottom portion of a chassis of the information handling system (e.g., a portable information handling system, such as a laptop) has no vent. In one example, using a flat top fan as a baseline, a funnel top fan may have about ten percent less airflow than the flat top baseline fan. In another example, using the flat top fan as a baseline, a dome top fan may have about twenty percent less airflow than the flat top baseline fan. In one or more embodiments, the dome top fan may reduce a portion of outer area of a blade, which may be more useful in generating airflow than an inner portion of the blade. For example, because of this, the funnel top fan may produce greater airflow than the dome top fan, even though volumes of the chassis of the funnel top fan and the dome top fan may be the same or similar.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, an embedded controller (EC) 130, a volatile memory medium 150, non-volatile memory media 160 and 170, an I/O subsystem 175, and a network interface 180. As illustrated, EC 130, volatile memory medium 150, non-volatile memory media 160 and 170, I/O subsystem 175, and network interface 180 may be communicatively coupled to processor 120.

In one or more embodiments, one or more of EC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of EC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of EC 130, I/O subsystem 175, and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, OS 162 may include a management information exchange. In one example, the management information exchange may permit multiple components to exchange management information associated with managed elements and/or may permit control and/or management of the managed elements. In another example, the management information exchange may include a driver and/or a driver model that may provide an OS interface through which managed elements (e.g., elements of IHS 110) may provide information and/or notifications, among others. In one instance, the management information exchange may be or include a Windows Management Interface (WMI) for ACPI (available from Microsoft Corporation). In another instance, the management information exchange may be or include a Common Information Model (CIM) (available via the Distributed Management Task Force). In one or more embodiments, the management information exchange may include a combination of the WMI and the CIM. For example, WMI may be and/or may be utilized as an interface to the CIM. For instance, the WMI may be utilized to provide and/or send CIM object information to OS 162.

In one or more embodiments, processor 120 and one or more components of IHS 110 may be included in a system-on-chip (SoC). For example, the SoC may include processor 120 and a platform controller hub (not specifically illustrated).

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, IHS 110 may include one or more fans. For example, information handling system 110 may include fans 132A-132C. Although information handling system 110 is illustrated as including fans 132A-132C, information handling system 110 may include any number of fans 132, according to one or more embodiments. In one or more embodiments, EC 130 may control one or more of fans 132A-132C. For example, EC 130 may provide control information to a fan controller (not specifically illustrated), which may control one or more of fans 132A-132C. For instance, EC 130 may provide control information to the fan controller via a SMBus. In one or more embodiments, a fan 132 may generate one or more sounds as fan 132 operates to move air. For example, the one or more sounds the fan 132 generates may be quantified as one or more sound pressure levels.

In one or more embodiments, IHS 110 may include one or more sensors. For example, IHS 110 may include sensors 190A-190C. Although IHS 110 is shown with sensors 190A-190C, IHS 110 may include any number of sensors 190, according to one or more embodiments. For example, IHS 110 may include any number of sensors 190 at any number of respective physical locations within IHS 110. In one or more embodiments, sensors 190A-190C may be communicatively coupled to EC 130. For example, EC 190 may receive information from sensors 190A-190C.

In one or more embodiments, a sensor 190 may transform one or more physical phenomena into one or more signals. In one example, a sensor 190 may transform one or more physical phenomena into one or more analog signals and may provide the one or more analog signals to EC 130. For instance, EC 130 may receive the one or more analog signals. In another example, a sensor 190 may transform one or more physical phenomena into one or more digital signals and may provide the one or more digital signals to EC 130. For instance, EC 130 may receive the one or more digital signals. In one or more embodiments, a sensor 190 may provide temperature values to EC 130 via the one or more signals.

Figure 1B:
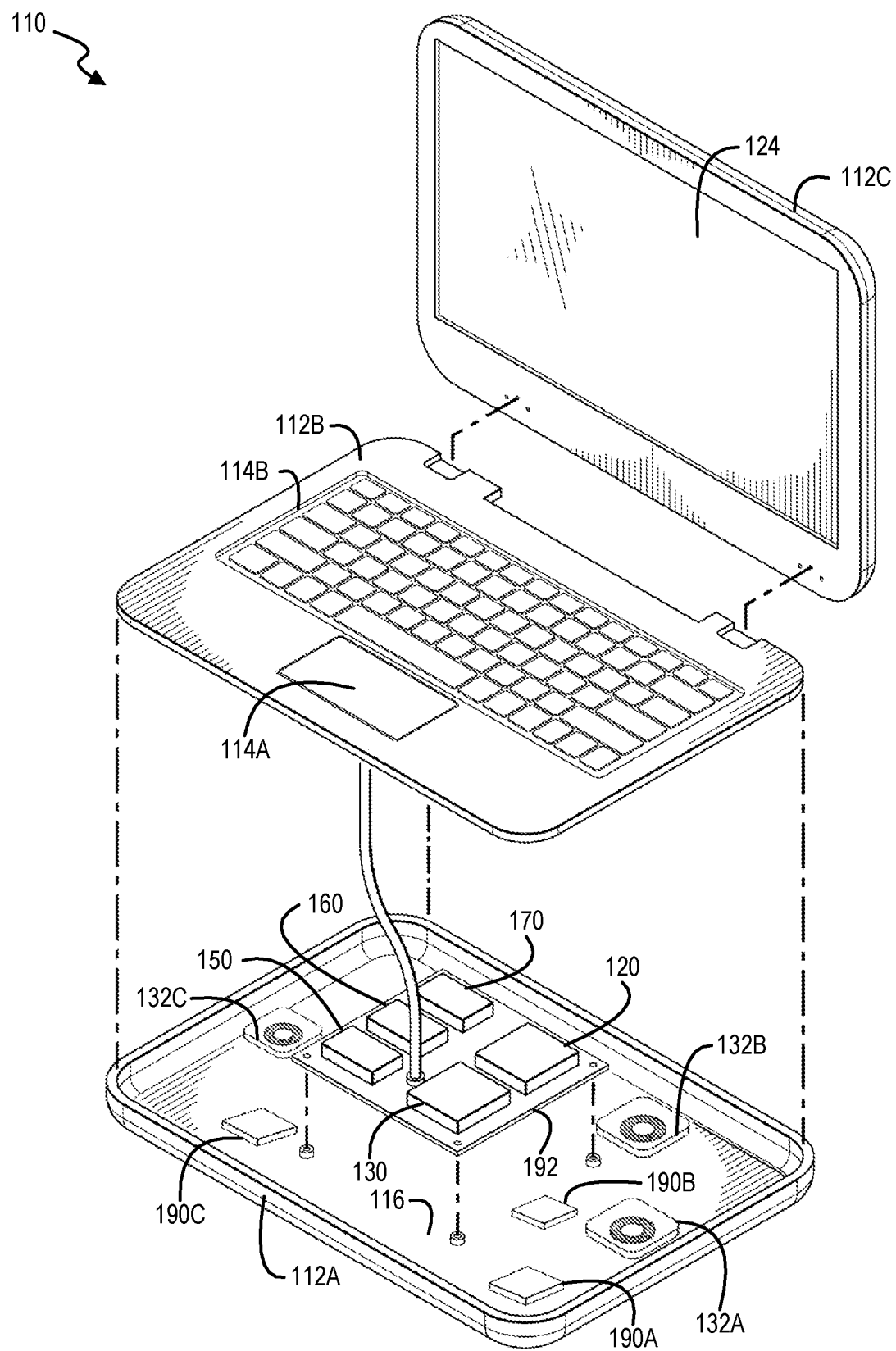
FIG. 1B illustrates a second example of an information handling system and an example of a portion of a keyboard, according to one or more embodiments.

Turning now to FIG. 1B, a second example of an information handling system and an example of a portion of a keyboard are illustrated, according to one or more embodiments. In one or more embodiments, IHS 110 may include a chassis 112. For example, chassis 112 may be or may include a housing. For instance, chassis 112 may house components of IHS 110. In one or more embodiments, IHS 110 may include chassis 112A-112C. In one example, chassis 112A may be or may include a bottom lid. In a second example, chassis 112B may include one or more human interface devices. In a third example, chassis 112C may be or may include a top lid. For instance, chassis 112C may include a display 124. In one or more embodiments, a motherboard 192 may be mounted to chassis 112A. For example, one or more components of IHS 110 may be mounted on motherboard 192. For instance, one or more of processor 120, EC 130, volatile memory medium 150, non-volatile memory medium 160, and non-volatile memory medium 170, among others, may be mounted on motherboard 192. As an example, motherboard 192 may be or may include a printed circuit board. In one or more embodiments, a flat, bottom portion 116 of chassis 112A may not have a vent. For example, a flat, bottom portion 116 may be unvented or may be without any vent. For instance, a user may prefer flat, bottom portion 116 to not have any vents. As an example, when flat, bottom portion 116 is in contact with a lap of the user, a vent in flat, bottom portion 116 may be blocked. Although not specifically illustrated, a fan 132 may be mounted on a side motherboard 192 that faces flat, bottom portion 116, according to one or more embodiments. For example, a fan 132 may be mounted on the side motherboard 192 that faces flat, bottom portion 116, and there may be a distance between fan 132 mounted on the side motherboard 192 that faces flat, bottom portion 116 and flat, bottom portion 116. For instance, fan 132 mounted on the side motherboard 192 that faces flat, bottom portion 116 may not be in physical contact with flat, bottom portion 116.

In one or more embodiments, IHS 110 may include one or more user interfaces. For example, the one or more user interfaces may include a human interface device (HID). For instance, the one or more user interfaces may include a HID 114A and a HID 114B, among others. As an example, HID 114A may be or may include a touchpad. As another example, HID 114B may be or may include a keyboard. In one or more embodiments, the one or more user interfaces may include display 124. For example, IHS 110 may display information via display 124. In one or more embodiments, display 124 may be or may include a touch screen. For example, the touch screen may be or may include a HID. In one or more embodiments, the one or more user interfaces may be communicatively coupled to processor 120. For example, HID 114A, HID 114B, and display 124 may be communicatively coupled to processor 120. In one or more embodiments, when display 124 is or includes a touch screen, the touch screen may be communicatively coupled to processor 120.

In one or more embodiments, fans 132A-132C may be mounted within chassis 112. Although fans 132A-132C are illustrated at specific physical locations, fans 132A-132C may be at any physical locations, according to one or more embodiments. Moreover, although IHS 110 is illustrated as including fans 132A-132C, IHS 110 may include any number of fans 132, according to one or more embodiments. In one or more embodiments, sensors 190A-190C may be mounted within chassis 112. Although sensors 190A-190C are illustrated at specific physical locations, sensors 190A-190C may be at any physical locations, according to one or more embodiments. Moreover, although IHS 110 is illustrated as including sensors 190A-190C, IHS 110 may include any number of sensors 190, according to one or more embodiments. In one or more embodiments, EC 130 may control fans 132A-132C. For example, EC 130 may control fans 132A-132C based at least on one or more temperature values determined via one or more of sensors 190A-190C.

Figure 1C:
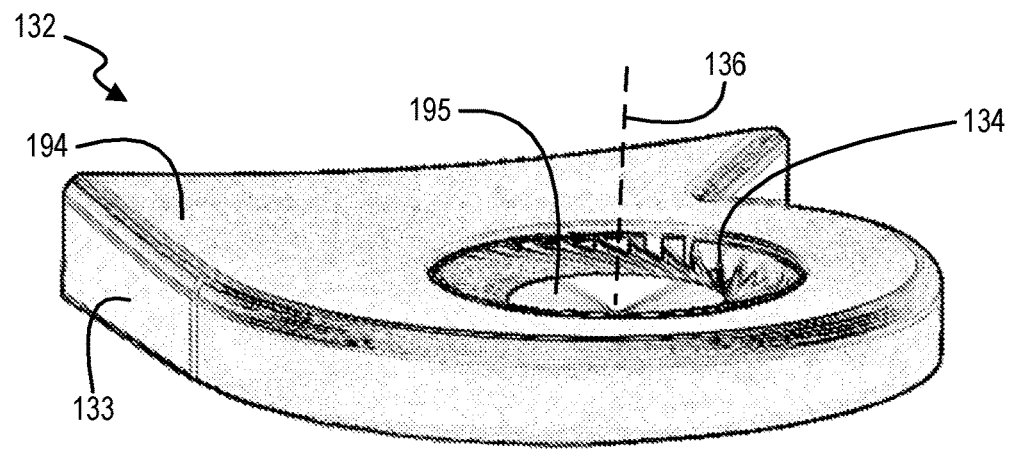
FIGS. 1C and 1D illustrate examples of a fan, according to one or more embodiments.
Figure 1D:
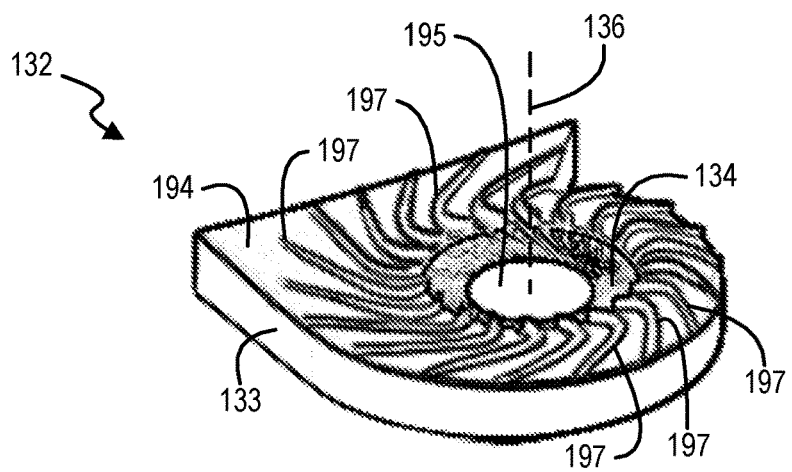

Turning now to FIGS. 1C and 1D, examples of a fan are illustrated, according to one or more embodiments. In one or more embodiments, a fan 132 may include a housing 133 and fan blades 134. For example, housing 133 may house fan blades 134. For instance, fan blades 134 may rotate to move air into fan 132. As an example, fan blades 134 may rotate to draw air into fan 132. In one or more embodiments, fan 132 may be a centrifugal fan. In one or more embodiments, a portion 194 of housing 133 may be concave.

In one or more embodiments, fan 132 may include a hub 195. For example, fan blades 134 may be radially attached to hub 195. For instance, fan blades 134 may radially extend from hub 195. In one or more embodiments, hub 195 may be perpendicular to a longitudinal axis 136 of fan 132. For example, fan blades 134 may rotate perpendicularly to longitudinal axis 136 of fan 132. For instance, longitudinal axis 136 of fan 132 may be or may include a rotational axis of fan blades 134. As an example, fan blades 134 may rotate perpendicularly to the rotational axis of fan blades 134. In one or more embodiments, hub 195 and fan blades 134 may form a blower of fan 132.

In one or more embodiments, portion 194 of housing 133 may have baffles 197, as shown in FIG. 1D. For example, baffles 197 may stand proud of a surface of portion 194 of housing 133. For instance, baffles 197 may direct at least a portion of air drawn into fan 132. In one or more embodiments, baffles 197 may include one or more curved portions. For example, the one or more curved portions of baffles 197 may direct at least a portion of air drawn into fan 132.

Figure 1E:
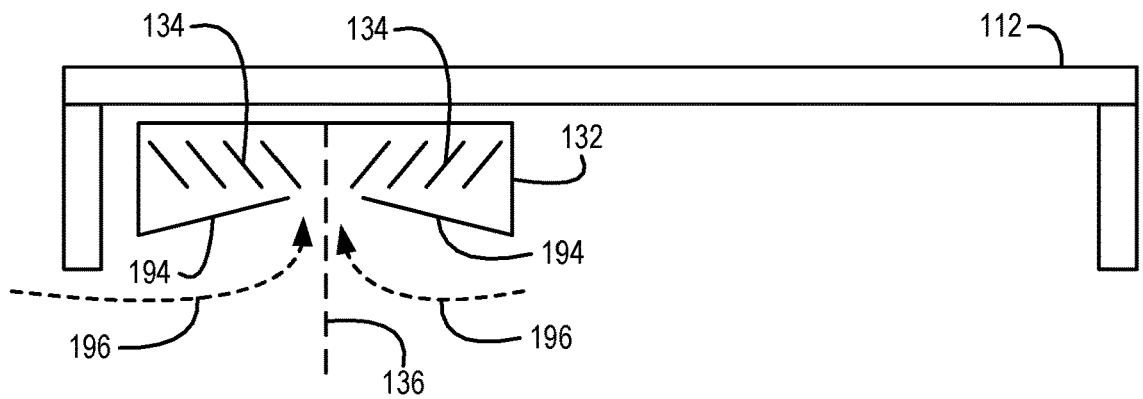
FIGS. 1E-1H illustrate examples of a fan mounted within a chassis of an information handling system, according to one or more embodiments.
Figure 1F:
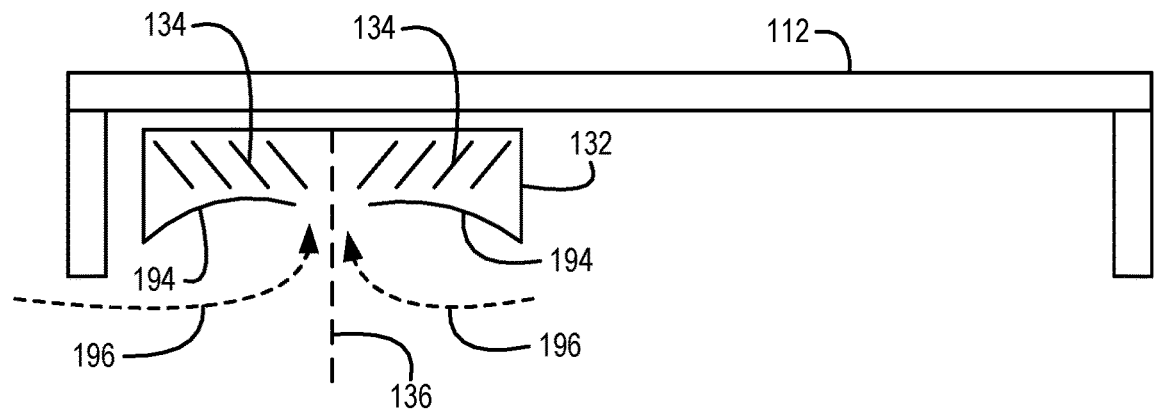
Figure 1G:
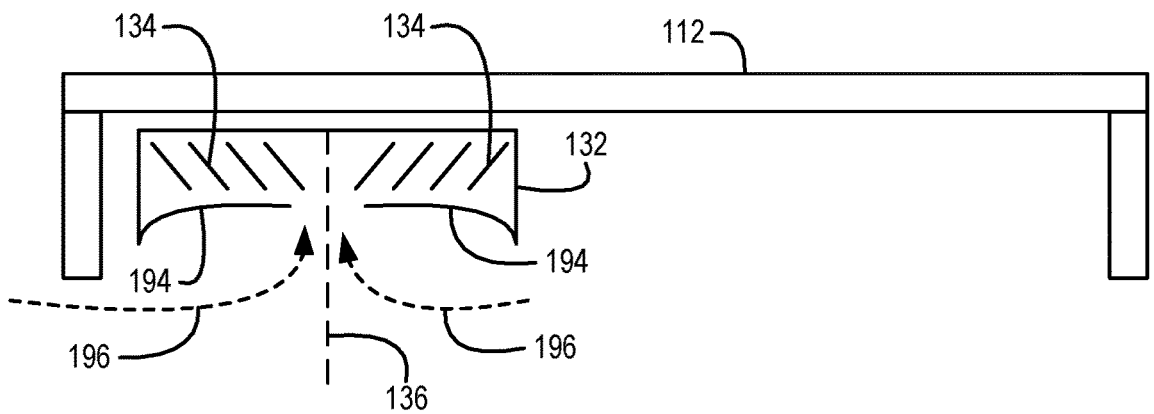
Figure 1H:
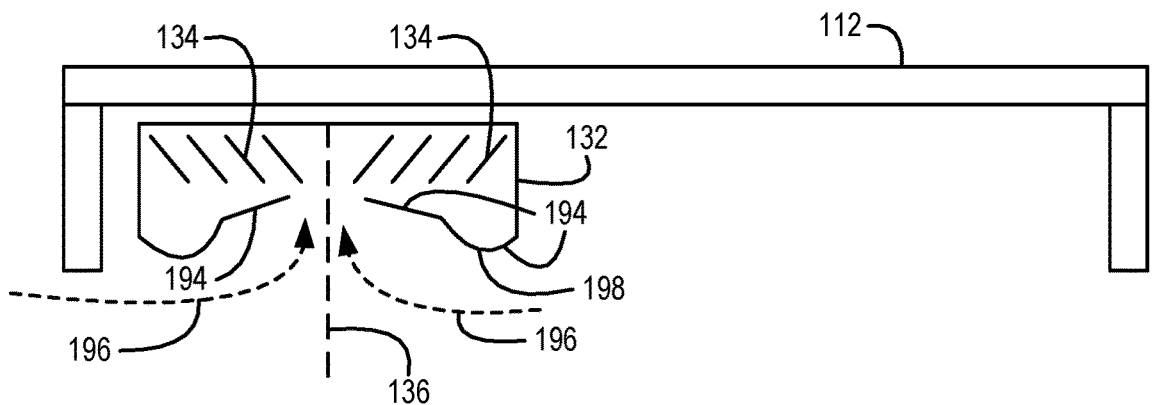

Turning now to FIGS. 1E-1H, examples of a fan mounted within a chassis of an information handling system are illustrated, according to one or more embodiments. In one or more embodiments, airflow may be represented via dotted lines 196. In one or more embodiments, portion 194 of the housing of fan 132 may be one or more of linearly concave, nonlinearly concave, polynomially concave, spherically concave, and exponentially concave, among others (e.g., giving fan 132 a funnel shape at an inlet). In one example, portion 194 of housing 133 may be linearly concave, as shown in FIG. 1E. In a second example, portion 194 of housing 133 may be spherically concave, as illustrated in FIG. 1F. In another example, portion 194 of housing 133 may be exponentially concave, as shown in FIG. 1G. In one or more embodiments, portion 194 of housing 133 may be any combination of two or more of linearly concave, non-linearly concave, polynomially concave, spherically concave, and exponentially concave, among others. In one or more embodiments, portion 194 of the housing of fan 132 may be convex and concave, as illustrated in FIG. 1H. For example, portion 194 of housing 133 may include a convex portion 198.

Figure 1I:
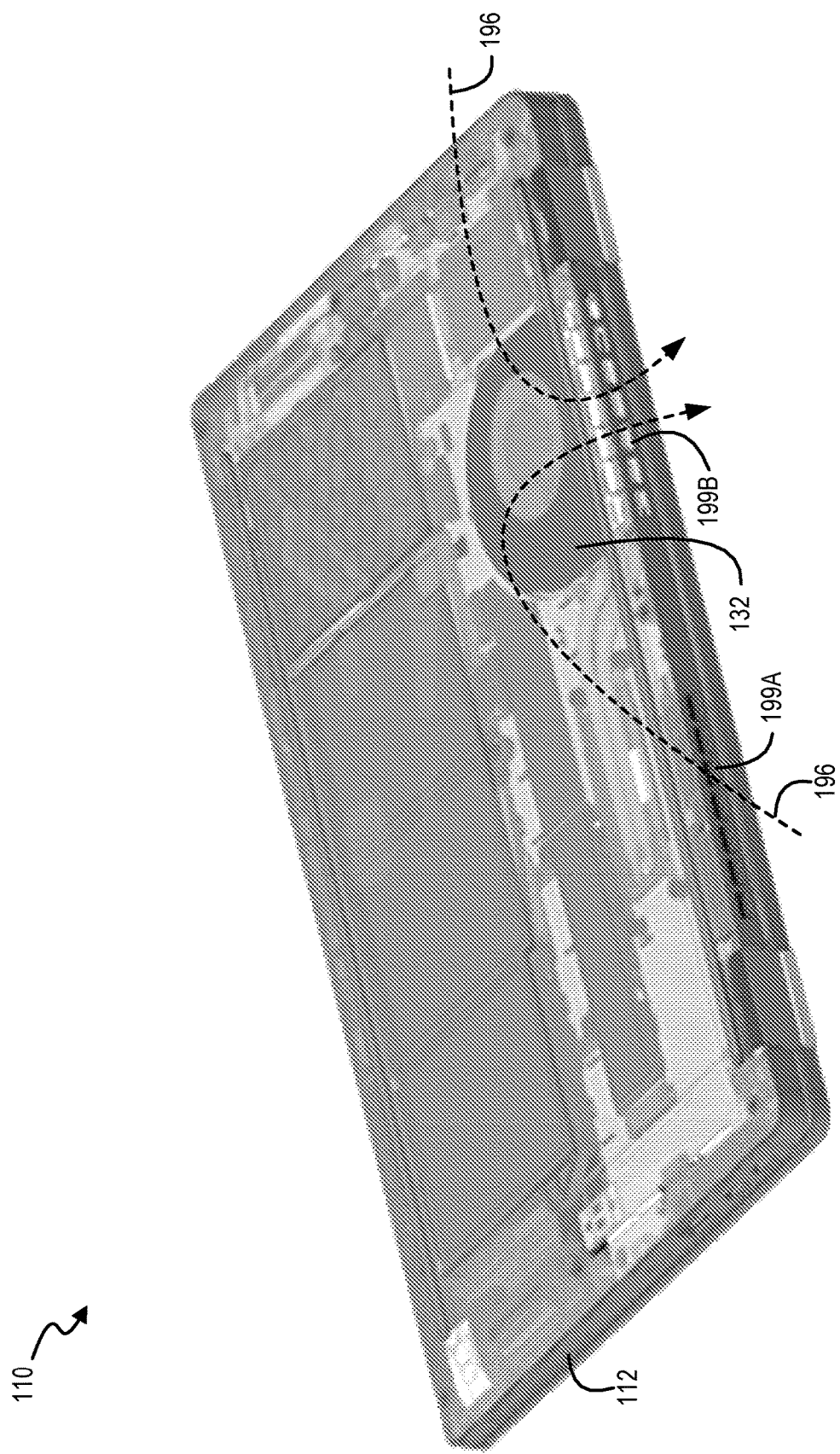
FIG. 1I illustrates another example of an information handling system, according to one or more embodiments.

Turning now to FIG. 1I, another example of an information handling system is illustrated, according to one or more embodiments. In one or more embodiments, housing 112 of IHS 110 may include vents 199. In one example, air may be drawn into IHS 110 via a vent 199A. For instance, fan 132 may draw air into IHS 110 via vent 199A. In another example, air may be exhausted from IHS 110 via a vent 199B. For instance, fan 132 may exhaust air from IHS 110 via vent 199B. In one or more embodiments, flow of air through IHS 110 may be shown via dotted lines 196.

Figure 2:
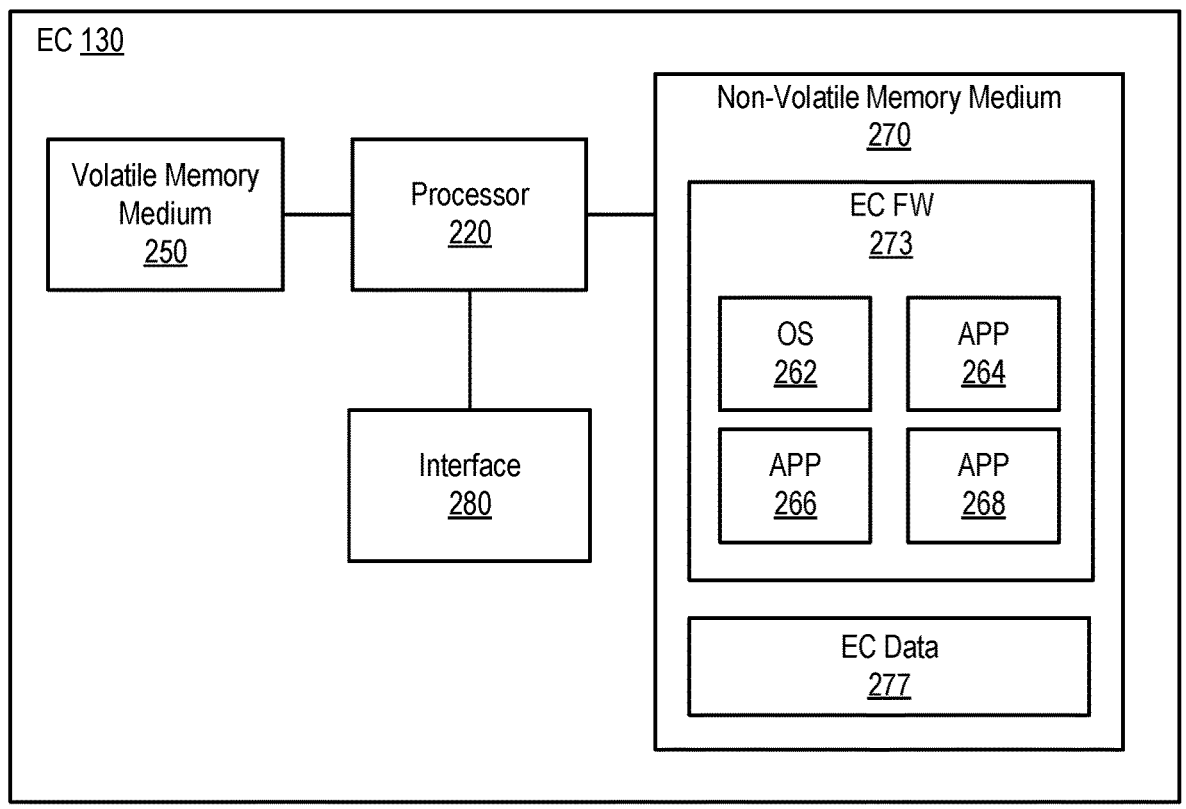
FIG. 2 illustrates an example of an embedded controller, according to one or more embodiments.

Turning now to FIG. 2, an example of an embedded controller is illustrated, according to one or more embodiments. As shown, EC 130 may include a processor 220, a volatile memory medium 250, a non-volatile memory medium 270, and an interface 280. As illustrated, non-volatile memory medium 270 may include a EC firmware (FW) 273, which may include an OS 262 and APPs 264-268, and may include EC data 277. In one example, OS 262 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 262 may be or include an Unix-like operating system. For instance, the Unix-like operating system may be or include LINUX®, FREEBSD®, NETBSD®, OpenBSD, Minix, Xinu, or Darwin, among others. In another example, OS 262 may be or include a portable operating system interface (POSIX) compliant operating system.

In one or more embodiments, interface 280 may include circuitry that enables communicatively coupling to one or more devices. In one example, interface 280 may include circuitry that enables communicatively coupling to one or more buses. For instance, the one or more buses may include one or more buses described herein, among others. In a second example, interface 280 may include circuitry that enables one or more interrupt signals to be received. In one instance, interface 280 may include general purpose input/output (GPIO) circuitry, and the GPIO circuitry may enable one or more interrupt signals to be received and/or provided via at least one interrupt line. In another instance, interface 280 may include GPIO circuitry that may enable EC 130 to provide and/or receive signals associated with other circuitry (e.g., diagnostic circuitry, etc.). In a third example, interface 280 may include circuitry that enables communicatively coupling to one or more networks. In one instance, interface 280 may include circuitry that enables communicatively coupling to network interface 180. In another example, interface 280 may include a network interface.

In one or more embodiments, one or more of OS 262 and APPs 264-268 may include processor instructions executable by processor 220. In one example, processor 220 may execute processor instructions of one or more of OS 262 and APPs 264-268 via non-volatile memory medium 270. In another example, one or more portions of the processor instructions of the one or more of OS 262 and APPs 264-268 may be transferred to volatile memory medium 250, and processor 220 may execute the one or more portions of the processor instructions of the one or more of OS 262 and APPs 264-268 via volatile memory medium 250. In one or more embodiments, processor 220 may execute instructions in accordance with at least a portion of one or more systems, at least a portion of one or more flowcharts, one or more methods, and/or at least a portion of one or more processes described herein. For example, non-volatile memory medium 270 and/or volatile memory medium 250 may store instructions that may be executable in accordance with at least a portion of one or more systems, at least a portion of one or more flowcharts, at least a portion of one or more methods, and/or at least a portion of one or more processes described herein. In one or more embodiments, processor 220 may utilize EC data 277. In one example, processor 220 may utilize EC data 277 via non-volatile memory medium 270. In another example, one or more portions of EC data 277 may be transferred to volatile memory medium 250, and processor 220 may utilize EC data 277 via volatile memory medium 250.

Figure 3A:
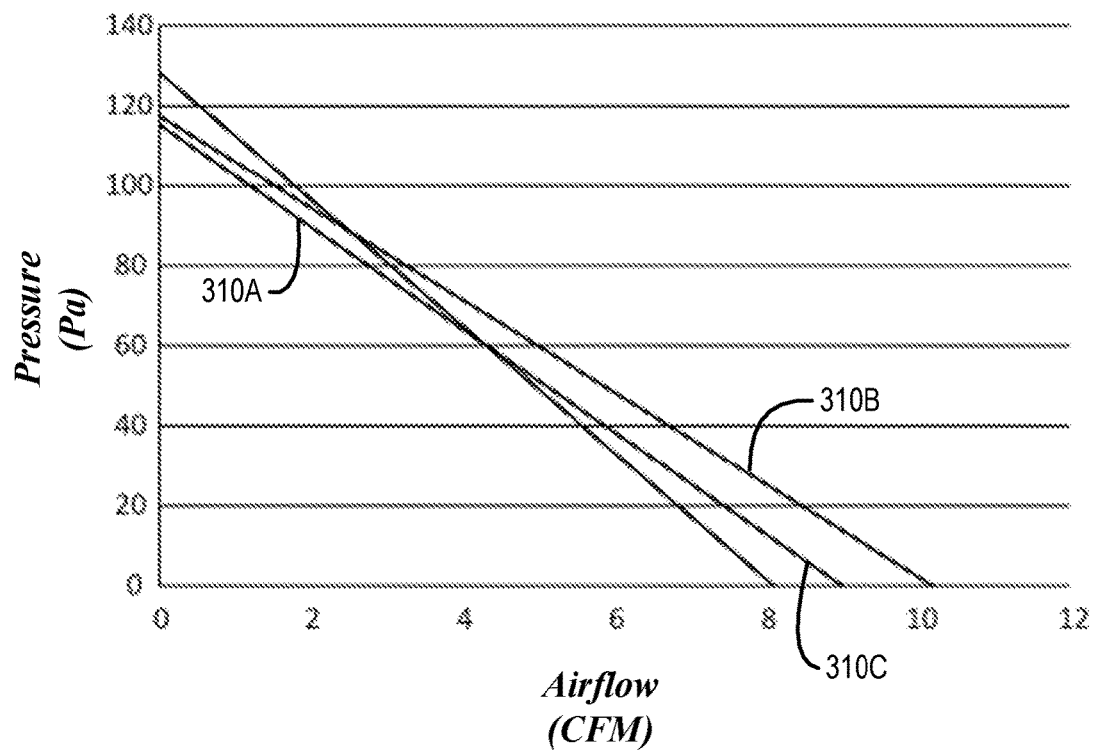
FIG. 3A illustrates an example diagram of air pressure versus airflow for different fan housing configurations in free air, according to one or more embodiments.
Figure 3B:
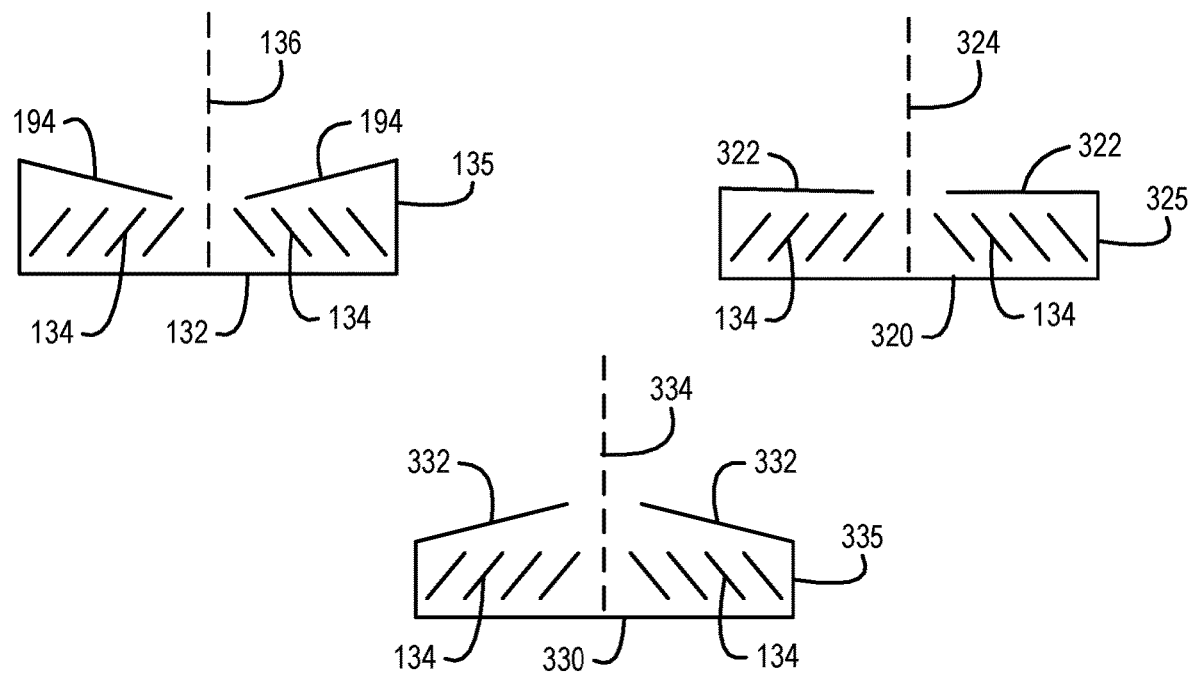
FIG. 3B illustrates examples of fans with a concave portion of a housing of a first fan, a flat portion of a housing of a second fan, and a convex portion of a housing of a third fan, according to one or more embodiments.

Turning now to FIG. 3A, an example diagram of air pressure versus airflow for different fan housing configurations in free air is illustrated, according to one or more embodiments. In one example, a plot 310A may represent air pressure versus airflow for a fan 132, as shown in FIG. 3B. For instance, fan 132 may include a portion 194 of a fan housing, which may be concave (e.g., a funnel shape at an inlet). In a second example, a plot 310B may represent air pressure versus airflow for a fan 320, as illustrated in FIG. 3B. For instance, fan 320 may include a portion 322 of a fan housing, which may not be concave and may not be convex (e.g., a flat top fan). As an example, portion 322 of the fan housing of fan 320 may be perpendicular to a longitudinal axis 324 of fan 320. In another example, a plot 310C may represent air pressure versus airflow for a fan 330, as shown in FIG. 3B. For instance, fan 330 may include a portion 332 of a fan housing, which may be convex (e.g., a dome top fan).

Figure 3C:
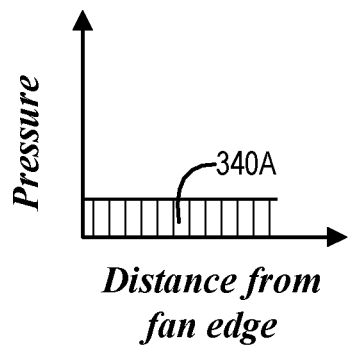
FIGS. 3C-3E illustrate examples of air pressures versus distance from a fan edge, according to one or more embodiments.
Figure 3D:
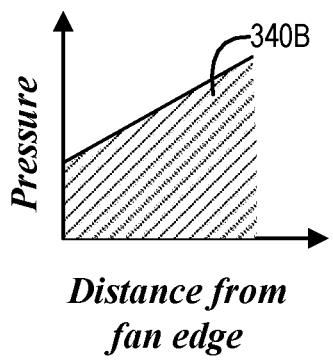
Figure 3E:
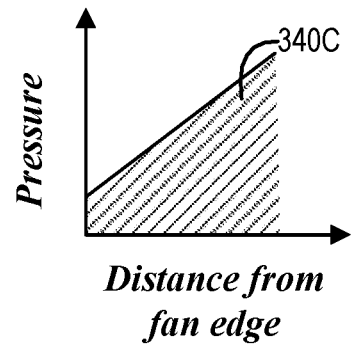

Turning now to FIGS. 3C-3E, examples of air pressures versus distance from a fan edge are illustrated, according to one or more embodiments. In one example, in FIG. 3C, a plot 340A shows of an air pressure versus distance from a fan edge 135 (shown in FIG. 3B) of fan 132 to longitudinal axis 136. In a second example, in FIG. 3D, a plot 340B illustrates of an air pressure versus distance from a fan edge 325 (shown in FIG. 3B) of fan 320 to longitudinal axis 324. In another example, in FIG. 3E, a plot 340C shows of an air pressure versus distance from a fan edge 335 (shown in FIG. 3B) of fan 330 to longitudinal axis 334.

Figure 3F:
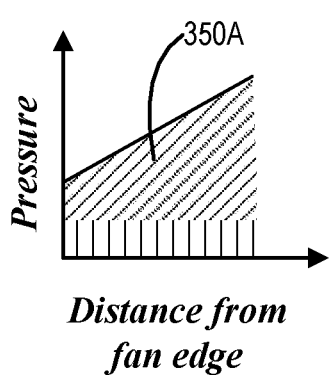
FIGS. 3F and 3G illustrate examples of differences in air pressures, according to one or more embodiments.
Figure 3G:
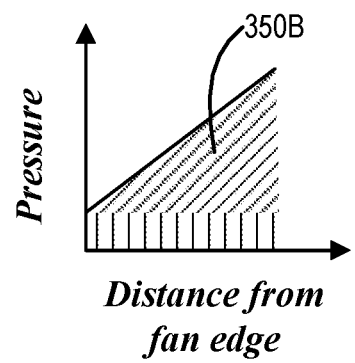

Turning now to FIGS. 3F and 3G, examples of differences in air pressures are illustrated, according to one or more embodiments. In one example, a difference in air pressure 350A between fan 320 and fan 132 is shown in FIG. 3F. In another example, a difference in air pressure 350B between fan 330 and fan 132 is shown in FIG. 3G.

Turning now to FIG. 4A, an example of a fan with linearly radiating fan blades is illustrated, according to one or more embodiments. In one or more embodiments, fan blades 134A-134H may linearly radiate from hub 195. In one or more embodiments, air may be drawn into fan 132 via a vent 410 in portion 194 of housing 133. For example, the air may ingress fan 132 via vent 410 in portion 194 of housing 133. In one or more embodiments, the air may be exhausted from fan 132 via a vent 420 in housing 133. For example, the air may egress fan 132 via vent 420 in housing 133. In one or more embodiments, fan 132 may include a drive shaft 430. For example, drive shaft 430 may attach hub 195 to an electric motor. For instance, the electric motor may rotate drive shaft 430, which may rotate hub 195. In one or more embodiments, hub 195 may rotate fan blades 134. For example, when fan blades 134 rotate, air may ingress fan 132 via vent 410, and the air may egress fan 132 via vent 420. In one or more embodiments, fan 132 may include a duct 435 between fan blades 134 and vent 420. In one example, a portion of duct 435 may be formed by a portion of housing 133. In another example, duct 435 may be formed by a portion of housing 133.

Turning now to FIG. 4B, an example of a fan with nonlinearly radiating fan blades is illustrated, according to one or more embodiments. In one or more embodiments, fan blades 134A-134H may nonlinearly radiate from hub 195. For example, fan blades 134A-134H may be curved.

Turning now to FIG. 4C, an example of a fan with linearly flat fan blades is illustrated, according to one or more embodiments. In one or more embodiments, a top 440 of a fan blade 134 may be linearly flat. For example, a top 440 of a fan blade 134 may be linear and perpendicular to longitudinal axis 136 of fan 132. For instance, fan blade 134 may not correspond to a profile of portion 194.

Turning now to FIG. 4D, an example of a fan with fan blades corresponding to a concave portion of a housing of the fan is illustrated, according to one or more embodiments. In one or more embodiments, fan blades 134 may correspond to portion 194, which may be concave. For example, a top 442 of a fan blade 134 may correspond to a profile of portion 194, which may be concave. In one instance, top 442 of fan blade 134 may correspond to a spherical profile. In another instance, top 442 of fan blade 134 may correspond to an exponential profile. In one or more embodiments, when the fan blades correspond to a portion of the housing of the fan, additional airflow may be achieved without increasing a speed of the fan blades. In one example, when additional airflow may be achieved without increasing a speed of the fan blades, the fan may provide additional airflow without substantially increasing sound levels produced by the fan. In another example, when additional airflow may be achieved without increasing a speed of the fan blades, the fan may be more efficient.

Turning now to FIG. 4E, another example of a fan with fan blades corresponding to a concave portion of a housing of the fan is illustrated, according to one or more embodiments. In one or more embodiments, fan blades 134 may correspond to portion 194, which may be concave. For example, a top 444 of a fan blade 134 may correspond to a profile of portion 194, which may be concave. For example, portion 194 may be linearly concave.

Figure 4F:
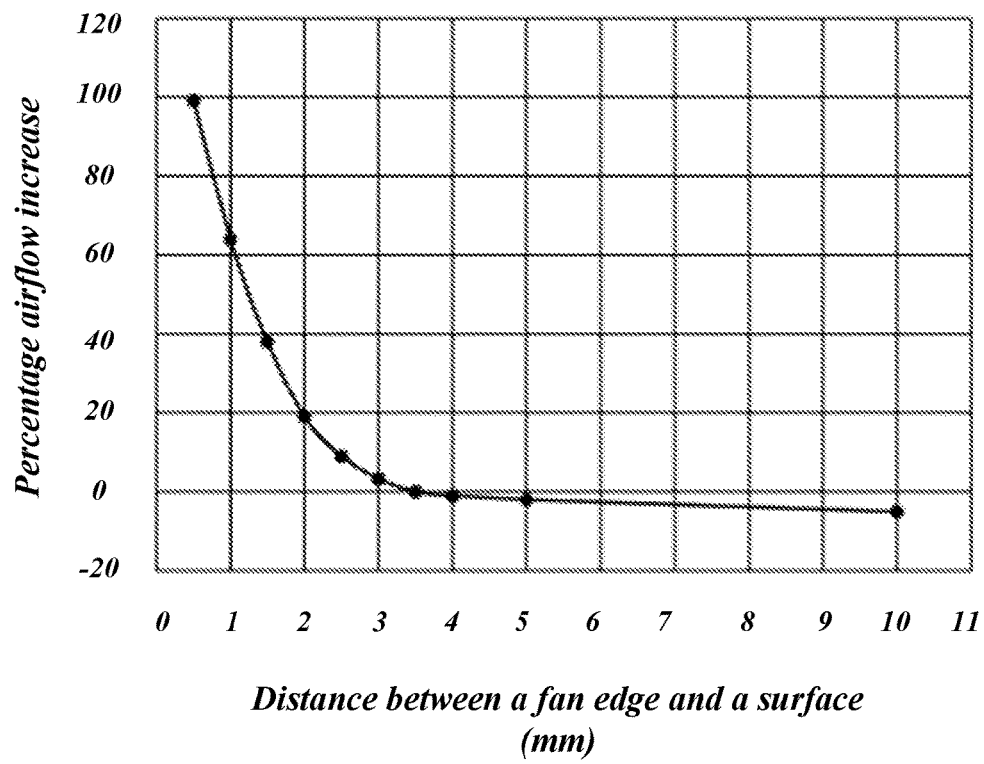
FIG. 4F illustrates an example of a plot of percentage airflow increase versus a distance between a fan edge and a surface, according to one or more embodiments.
Figure 4G:
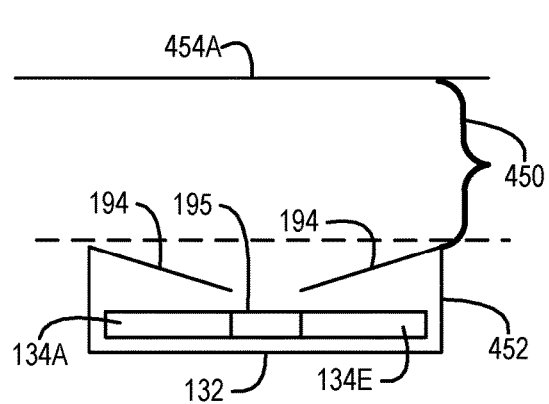
FIG. 4G illustrates an example of a distance between a fan and a surface that is smooth, according to one or more embodiments.
Figure 4H:
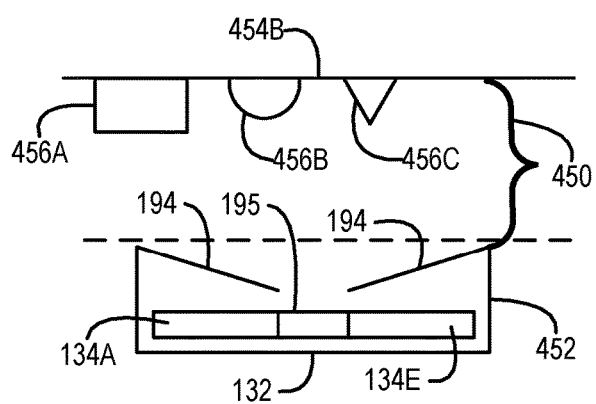
FIG. 4H illustrates an example of a distance between a fan and a surface that is not smooth, according to one or more embodiments.

Turning now to FIG. 4F, an example of a plot of percentage airflow increase versus a distance between a fan edge and a surface is illustrated, according to one or more embodiments. In one or more embodiments, percentage airflow may decrease as a distance 450 (shown in FIGS. 4G and 4H) between a fan edge 452 of fan 132 and a surface 454 increases. In one example, a surface 454A may be smooth, as illustrated in FIG. 4G. For instance, surface 454A may be a surface of flat, bottom portion 116 of chassis 112A. In another example, a surface 454B may not be smooth, as illustrated in FIG. 4H. For instance, components of IHS 110 may cause surface 454B to not be smooth. As an example, surface 454B may include one or more different shapes, such as one or more of shapes 456A-456C, among others.

In one or more embodiments, components of IHS 110 may include processor 120, EC 130, volatile memory medium 150, non-volatile memory medium 160, non-volatile memory medium 170, I/O subsystem 175, network interface 180, chassis 112, one or more printed circuit boards, one or more resistors, one or more transistors, one or more diodes, one or more capacitors, and/or one or more coils, among others. In one or more embodiments, one or more surfaces 454 and/or one or more components of IHS 110 may positioned such that a distance 450 may be minimized. For example, one or more surfaces 454 and/or one or more components of IHS 110 may be positioned such that a percentage airflow may be maximized. In one or more embodiments, a fan 132 may be may positioned within IHS 110 such that a distance 450 may be minimized. For example, a fan 132 may be may positioned within IHS 110 such that a percentage airflow may be maximized.

Figure 5A:
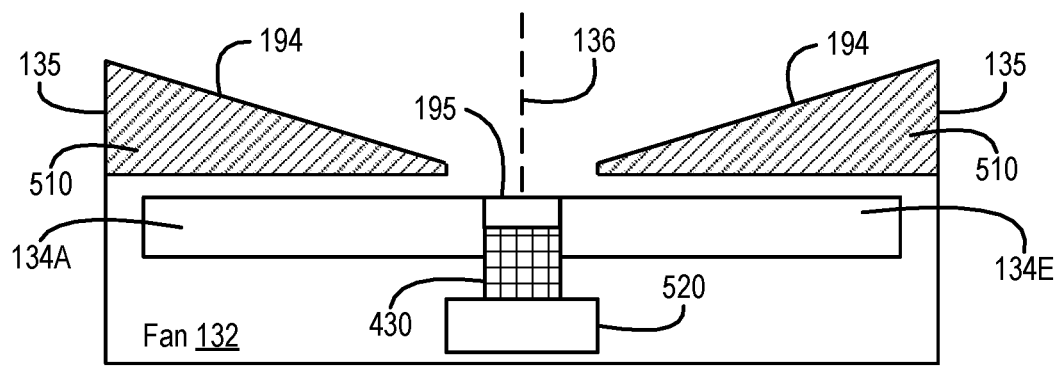
FIGS. 5A-5C illustrate examples thicknesses of concave portions of fan housings, according to one or more embodiments.
Figure 5B:
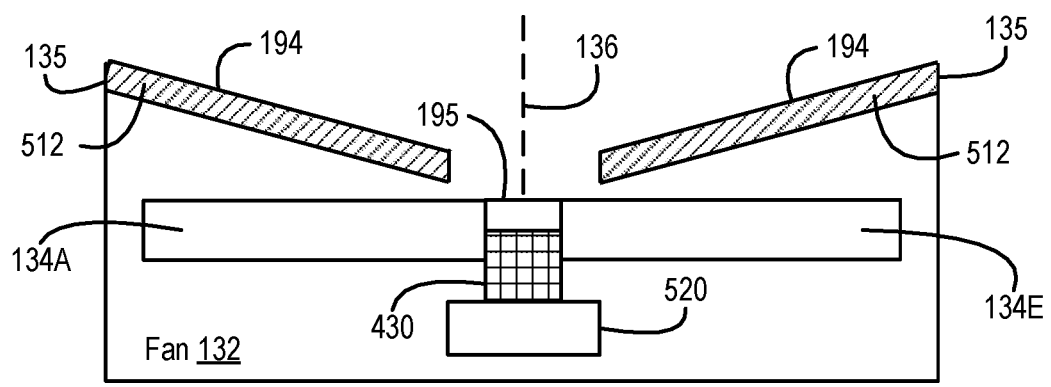
Figure 5C:
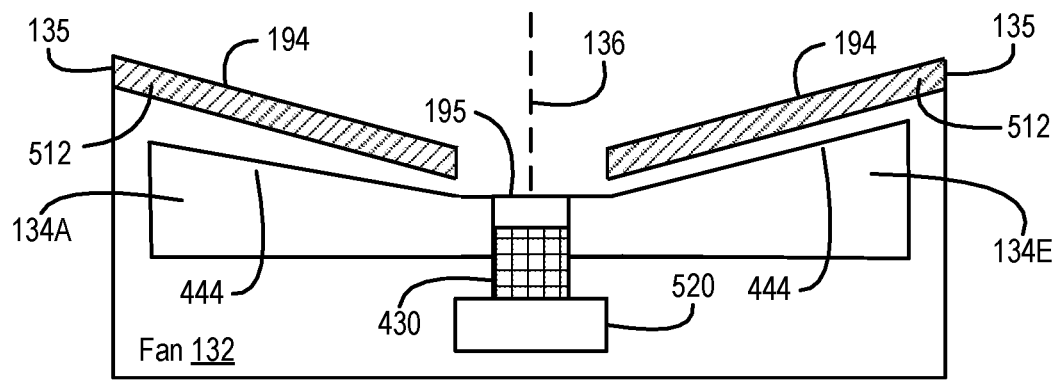

Turning now to FIGS. 5A-5C, examples thicknesses of concave portions of fan housings are illustrated, according to one or more embodiments. In one or more embodiments, a thickness 510 of housing portion 194 may vary, as shown in FIG. 5A. For example, thickness 510 of housing portion 194 may taper, which may produce a concave portion of fan 132. For instance, thickness 510 of housing portion 194 may taper from an outer edge 135 of fan 132 towards longitudinal axis 136 or to vent 410. In one or more embodiments, thickness 510 of housing portion 194 may be produced via an injection molding process. In one example, housing portion 194 may include a polymer. In another example, housing portion 194 may include a metal. In one or more embodiments, thickness 510 of housing portion 194 may be produced via a milling process. For example, housing portion 194 may be milled, which may produce a concave portion of fan 132. In one instance, housing portion 194 may include a polymer, which may be milled produce a concave portion of fan 132. In another instance, housing portion 194 may include a metal, which may be milled produce a concave portion of fan 132.

In one or more embodiments, a thickness 512 of housing portion 194 may be uniform, as shown in FIG. 5B. For example, thickness 512 of housing portion 194 may be uniform, which may produce a concave portion of fan 132. In one instance, housing portion 194 may include a polymer. In another instance, housing portion 194 may include a metal. In one or more embodiments, thickness 512 of housing portion 194 may be produced via an injection molding process. In one or more embodiments, thickness 512 of housing portion 194 may be produced via a milling process. For example, housing portion 194 may be milled, which may produce a concave portion of fan 132. In one instance, housing portion 194 may include a polymer, which may be milled produce a concave portion of fan 132. In another instance, housing portion 194 may include a metal, which may be milled produce a concave portion of fan 132.

In one or more embodiments, fan 132 may include an electric motor 520. For example, electric motor 520 may be attached to drive shaft 430. For instance, drive shaft 430 may be attached to hub 195. As an example, drive shaft 430 may attach electric motor 520 to hub 195. For instance, electric motor 520 may rotate drive shaft 430, which may rotate hub 195. In one or more embodiments, hub 195 may be attached to a bearing of electric motor 520. For example, electric motor 520 may rotate the bearing of electric motor 520, which may rotate hub 195. In one or more embodiments, electric motor 520 may be or may include a direct current (DC) electric motor. In one example, electric motor 520 may be or may include a brushless electric motor. In another example, electric motor 520 may be or may include a brushed electric motor. In one or more embodiments, a speed of electric motor 520 may be controlled via pulse width modulation. In one or more embodiments, a top 444 of a fan blade 134 may correspond to a profile of portion 194, as shown in FIG. 5C.

Figure 5D:
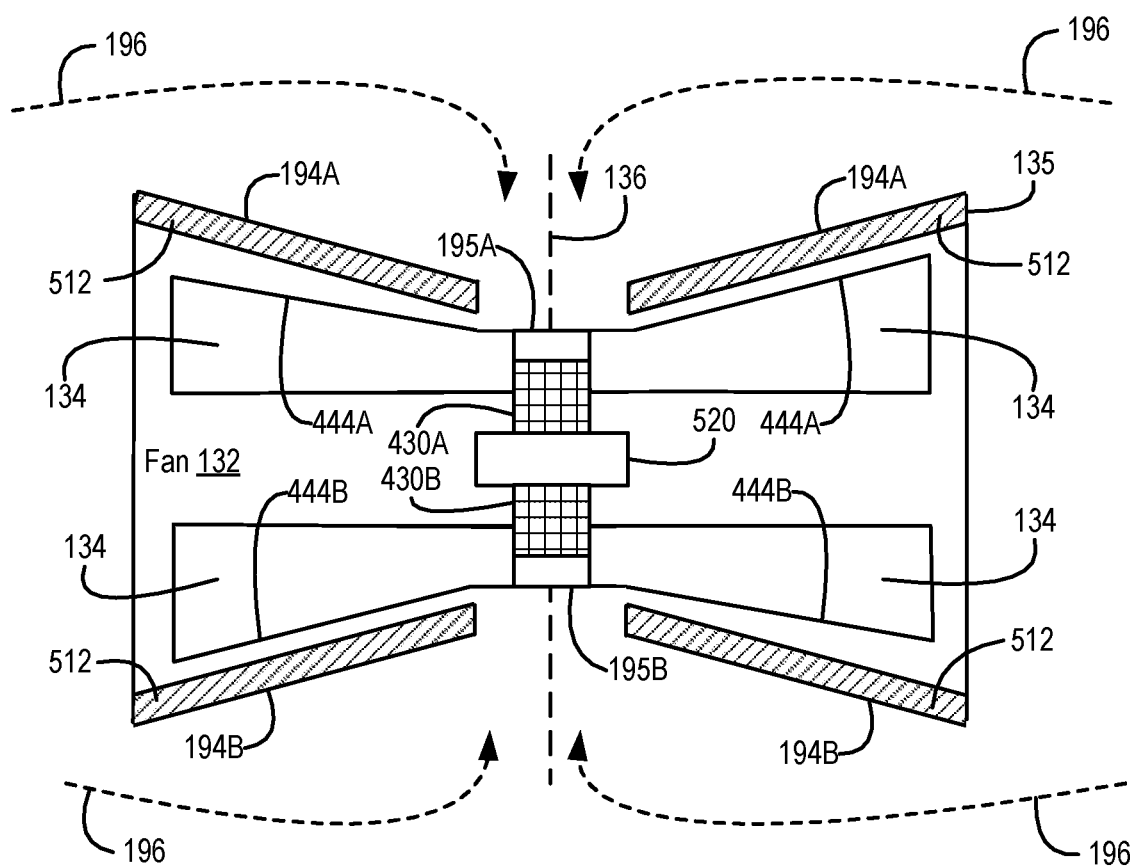
FIG. 5D illustrates an example of a fan with multiple intakes, according to one or more embodiments.

Turning now to FIG. 5D, an example of a fan with multiple intakes is illustrated, according to one or more embodiments. In one or more embodiments, a fan may include multiple intakes. For example, fan 132 may include multiple intakes. For instance, fan 132 may include multiple intake vents 410. As an example, fan 132 may exhaust air via vent 420. In one or more embodiments, a portion 194A of housing 133 may be concave, and a portion 194B of housing 133 may be concave. For example, portion 194A of housing 133 may associated with a first intake of the multiple intakes of fan 132, and portion 194B of housing 133 may associated with a second intake of the multiple intakes of fan 132.

In one or more embodiments, fan 132 may include multiple drive shafts. For example, fan 132 may include drive shafts 430A and 430B. For instance, electric motor 520 may be attached to drive shafts 430A and 430B. In one or more embodiments, fan 132 may include multiple hubs. For example, fan 132 may include multiple hubs 195A and 195B. For instance, drive shaft 430A may be attached to a hub 195A (e.g., a first hub) of fan 132, and drive shaft 430B may be attached to a hub 195B (e.g., a second hub) of fan 132. As an example, first multiple fan blades 134 may be radially attached to hub 195A. For instance, first multiple fan blades 134 may radially extend from hub 195A. As another example, second multiple fan blades 134 may be radially attached to hub 195B. For instance, second multiple fan blades 134 may radially extend from hub 195B.

In one or more embodiments, hubs 195A and 195B may be perpendicular to longitudinal axis 136 of fan 132. For example, first multiple fan blades 134 may rotate perpendicularly to longitudinal axis 136 of fan 132, and second multiple fan blades 134 may rotate perpendicularly to longitudinal axis 136 of fan 132. For instance, longitudinal axis 136 of fan 132 may be or may include a rotational axis of first multiple fan blades 134, and longitudinal axis 136 of fan 132 may be or may include a rotational axis of second multiple fan blades 134. As an example, first multiple fan blades 134 may rotate perpendicularly to the rotational axis of first multiple fan blades 134, and second multiple fan blades 134 may rotate perpendicularly to the rotational axis of second multiple fan blades 134. In one or more embodiments, first multiple fan blades 134 and second multiple fan blades 134 may share a rotational axis. In one or more embodiments, hubs 195A and 195B, first multiple fan blades 134, and second multiple fan blades 134 may form a blower of fan 132. In one or more embodiments, airflow may be represented via dotted lines 196, which illustrate airflow into the multiple air intakes of fan 132.

Figure 6:
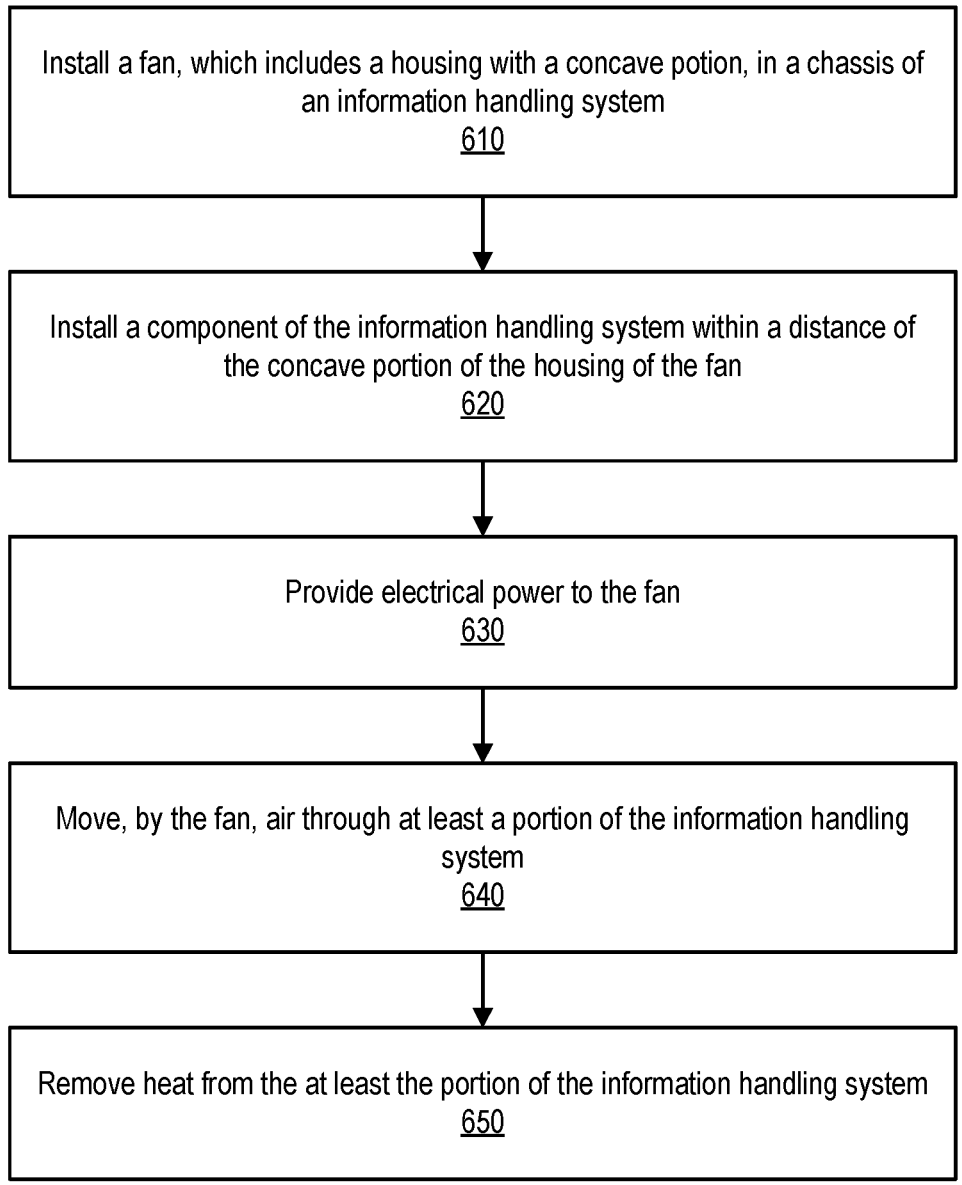
FIG. 6 illustrates an example of a method of utilizing a fan with an information handling system, according to one or more embodiments.

Turing now to FIG. 6, an example of a method of utilizing a fan with an information handling system is illustrated, according to one or more embodiments. At 610, a fan, which includes a housing with a concave portion, may be installed in a chassis of an information handling system. In one or more embodiments, the fan may be an information handling system fan. For example, fan 132 may be installed in chassis 112 of IHS 110. In one or more embodiments, the fan may include a hub, multiple fan blades radially attached to the hub and configured to rotate perpendicularly to a longitudinal axis of the fan, an electric motor, and a housing that houses the hub, the multiple fan blades, and the electric motor. For example, the housing may have a concave portion perpendicular to the longitudinal axis of the fan. In one instance, the housing may include a first vent in the concave portion of the housing to intake air as the multiple fan blades rotate. In another instance, the housing may include a second vent configured to exhaust the air as the multiple fan blades rotate.

In one or more embodiments, the concave portion of the housing of the fan may be linear from an edge of the housing of the fan to the first vent. For example, concave portion 194 may be linear from an edge of housing 133 of fan 132 (shown in FIG. 1E). For instance, concave portion 194 may be linear from an edge of housing 133 and vent 410. In one or more embodiments, the concave portion of the housing may be nonlinear from an edge of the housing to the first vent. For example, concave portion 194 may be nonlinear from an edge of housing 133 of fan 132. For instance, concave portion 194 may be nonlinear from an edge of housing 133 and vent 410. As one example, concave portion 194 may be spherical from an edge of housing 133 of fan 132 (shown in FIG. 1F). As another example, concave portion 194 may be exponential from an edge of housing 133 of fan 132 (shown in FIG. 1G).

In one or more embodiments, the fan may be configured to exhaust air perpendicularly to a longitudinal axis of the fan. For example, fan 132 may be configured to exhaust air perpendicularly to longitudinal axis 136. For instance, fan 132 may be a centrifugal fan. In one or more embodiments, the fan may include a duct between the multiple fan blades and the second vent. For example, fan 132 may include duct 435 between fan blades 134 and vent 420 (as shown in FIGS. 4A and 4B). In one or more embodiments, air may be drawn into fan 132 via vent 410. For example, the air may ingress fan 132 via vent 410. In one or more embodiments, the air may be exhausted from fan 132 via vent 420. For example, the air may egress fan 132 via vent 420.

In one or more embodiments, each fan blade of the multiple fan blades may have a top edge that corresponds to the concave portion of the housing of the fan. In one example, each fan blade 134 of fan blades 134A-134H may have top edge 442 that corresponds to concave portion 194 of housing 133 of fan 132 (as shown in FIG. 4D). In another example, each fan blade 134 of fan blades 134A-134H may have top edge 444 that corresponds to concave portion 194 of housing 133 of fan 132 (as shown in FIG. 4E). In one or more embodiments, each fan blade of the multiple fan blades may extend linearly from the hub within a plane perpendicular to the longitudinal axis of the fan. For example, each fan blade 134 of fan blades 134A-134H may extend linearly from hub 195 within a plane perpendicular to longitudinal axis 136 of fan 132 (as shown in FIG. 4A). In one or more embodiments, each fan blade of the multiple fan blades may extend nonlinearly from the hub within a plane perpendicular to the longitudinal axis of the fan. For example, each fan blade 134 of fan blades 134A-134H may extend nonlinearly from hub 195 within a plane perpendicular to longitudinal axis 136 of fan 132 (as shown in FIG. 4B). For instance, each fan blade 134 of fan blades 134A-134H may be curved within a plane perpendicular to longitudinal axis 136 of fan 132 (as shown in FIG. 4B).

In one or more embodiments, the concave portion of the housing of the fan may have baffles. For example, portion 194 of housing 133 of fan 132 may have baffles 197 (as shown in FIG. 1D). For instance, baffles 197 may be proud of a surface of portion 194 of housing 133. In one or more embodiments, baffles 197 may direct at least a portion of air drawn into fan 132. For example, baffles 197 may include one or more curved portions. For instance, the one or more curved portions of baffles 197 may direct the at least the portion of air drawn into fan 132.

At 620, a component of the information handling system may be installed within a distance of the concave portion of the housing of the fan. For example, a component of IHS 110 may be installed within a distance of the concave portion of housing 133 of fan 132. For instance, a component of IHS 110 may be installed within a distance 450 of the concave portion of housing 133 of fan 132. In one or more embodiments, the fan may be installed within a distance of a component of the information handling system. In one example, fan 132 may be within a distance of motherboard 192. In another example, fan 132 may be within a distance of chassis 112A.

At 630, power may be provided to the fan. For example, power may be provided to fan 132. In one or more embodiments, information that includes a temperature value may be received. In one example, processor 120 may receive information that includes a temperature value. For instance, processor 120 may receive the information that includes the temperature value from a sensor 190. As an example, sensor 190 may be communicatively coupled to processor 120. In another example, EC 130 may receive information that includes a temperature value. For instance, EC 130 may receive the information that includes the temperature value from a sensor 190. As an example, sensor 190 may be communicatively coupled to EC 130. In one or more embodiments, it may be determined that the temperature value is at or above a threshold temperature value. In one example, processor 120 may determine that the temperature value is at or above a threshold temperature value. In another example, EC 130 may determine that the temperature value is at or above a threshold temperature value.

In one or more embodiments, when it is determined that the temperature value is at or above a threshold temperature value, power may be provided to the fan. In one example, processor 120 may cause power to be provided to the fan. For instance, processor 120 may provide power to the fan. In another example, EC 130 may cause the fan to move air within the information handling system. For instance, EC 130 may provide power to the fan. In one or more embodiments, providing power to the fan may be performed in response to determining that the temperature value is at or above the threshold temperature value. In one or more embodiments, when it is determined that the temperature value is at or above a threshold temperature value, a speed of fan blades 134 may be increased. In one example, processor 120 may cause a speed of fan blades 134 may be increased when processor 120 determines that the temperature value is at or above a threshold temperature value. In another example, BMC 130 may cause a speed of fan blades 134 may be increased when BMC 130 determines that the temperature value is at or above a threshold temperature value.

At 640, air may be moved, by the fan, through at least a portion of the information handling system. For example, fan 132 may move air through at least a portion of IHS 110. In one or more embodiments, fan 132 may intake air from outside IHS 110. For example, fan 132 may intake air from outside IHS 110 via vent 199A (shown in FIG. 1I). In one or more embodiments, chassis 112 may include multiple intake vents 199. For example, fan 132 may intake air from outside IHS 110 via multiple intake vents 199. In one or more embodiments, fan 132 may exhaust air outside of IHS 110. For example, fan 132 may exhaust air outside of IHS 110 via vent 199B (shown in FIG. 1I). In one or more embodiments, chassis 112 may include multiple outlet vents 199. For example, fan 132 may exhaust air outside of IHS 110 via multiple outlet vents 199.

In one or more embodiments, the fan may be caused to move air within the information handling system. In one example, processor 120 may cause the fan to move air within the information handling system. For instance, processor 120 may provide power to the fan. As an example, processor 120 may cause power to be provided to the fan. In another example, EC 130 may cause the fan to move air within the information handling system. For instance, EC 130 may provide power to the fan. As an example, EC 130 may cause power to be provided to the fan. In one or more embodiments, causing the fan to move air within the information handling system may be performed in response to determining that the temperature value is at or above the threshold temperature value.

At 650, heat may be removed from the at least the portion of the information handling system. In one or more embodiments, as the air moves through the at least the portion of the information handling system, heat may be removed from the at least the portion of the information handling system. For example, as the air moves through the at least the portion of IHS 110, the air may remove heat from the at least the portion of IHS 110. For instance, as the air moves through the at least the portion of IHS 110, the air may remove heat from one or more components of IHS 110.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
at least one processor;
a memory medium, coupled to the at least one processor, that stores instructions executable by the at least one processor; and
a fan that includes:
a hub;
a plurality of fan blades radially attached to the hub and configured to rotate perpendicularly to a longitudinal axis of the fan;
an electric motor;
a drive shaft parallel to the longitudinal axis of the fan that attaches the electric motor to the hub; and
a housing that houses the hub, the plurality of fan blades, and the electric motor;
wherein the housing has a concave portion perpendicular to the longitudinal axis of the fan;
wherein the housing of the fan includes a first vent in the concave portion of the housing of the fan to intake air as the plurality of fan blades rotate, wherein the concave portion of the housing of the fan is linear from an edge of the housing to the first vent; and
wherein the housing of the fan includes a second vent configured to exhaust the air as the plurality of fan blades rotate.

2. The information handling system of claim 1, wherein the fan is configured to exhaust the air perpendicularly to the longitudinal axis of the fan.

3. The information handling system of claim 2, wherein the fan is a centrifugal fan.

4. The information handling system of claim 1, wherein the concave portion of the housing has a plurality of baffles.

5. The information handling system of claim 1, wherein each fan blade of the plurality of fan blades has a top edge that corresponds to the concave portion of the housing of the fan.

6. The information handling system of claim 1, wherein each fan blade of the plurality of fan blades extends linearly from the hub within a plane perpendicular to the longitudinal axis of the fan.

7. The information handling system of claim 1, wherein each fan blade of the plurality of fan blades extends non-linearly from the hub within a plane perpendicular to the longitudinal axis of the fan.

8. The information handling system of claim 1, wherein the instructions, which when executed by the at least one processor, cause the information handling system to:
receive temperature information that includes a temperature value;
determine that the temperature value is at or above a threshold temperature value; and
in response to determining that the temperature value is at or above the threshold temperature value, cause the fan to move air within the information handling system.

9. The information handling system of claim 4, wherein the plurality of baffles include one or more curved portions that are configured to direct at least a portion of air drawn into the fan.

10. An information handling system fan, comprising:
a hub;
a plurality of fan blades radially attached to the hub and configured to rotate perpendicularly to a longitudinal axis of the information handling system fan;
an electric motor;
a drive shaft parallel to the longitudinal axis of the information handling system fan that attaches the electric motor to the hub; and
a housing that houses the hub, the plurality of fan blades, and the electric motor;
wherein the housing has a concave portion perpendicular to the longitudinal axis of the information handling system fan;
wherein the housing includes a first vent in the concave portion of the housing to intake air as the plurality of fan blades rotate, wherein the concave portion of the housing is linear from an edge of the housing to the first vent; and
wherein the housing includes a second vent configured to exhaust the air as the plurality of fan blades rotate.

11. The information handling system fan of claim 10, wherein the information handling system fan is configured to exhaust the air perpendicularly to the longitudinal axis of the information handling system fan.

12. The information handling system fan of claim 11, wherein the information handling system fan is a centrifugal fan.

13. The information handling system fan of claim 10, wherein the housing includes a duct between the plurality of fan blades and the second vent.

14. The information handling system fan of claim 10, wherein the concave portion of the housing has a plurality of baffles.

15. The information handling system fan of claim 10, wherein each fan blade of the plurality of fan blades has a top edge that corresponds to the concave portion of the housing.

16. The information handling system fan of claim 10, wherein each fan blade of the plurality of fan blades extends linearly from the hub within a plane perpendicular to the longitudinal axis of the information handling system fan.

17. The information handling system fan of claim 10, wherein each fan blade of the plurality of fan blades extends nonlinearly from the hub within a plane perpendicular to the longitudinal axis of the information handling system fan.

18. The information handling system fan of claim 14, wherein the plurality of baffles include one or more curved portions that are configured to direct at least a portion of air drawn into the information handling system fan.

\* \* \* \* \*